United States Patent
Lin et al.

(10) Patent No.: US 12,471,310 B2
(45) Date of Patent: *Nov. 11, 2025

(54) METHOD OF MAKING A FINFET DEVICE INCLUDING A STEP OF REMOVING A PORTION OF A FIN

(71) Applicant: Taiwan Semiconductor Manufacturing Company, Ltd., Hsin-Chu (TW)

(72) Inventors: Chia Tai Lin, Taichung (TW); Yih-Ann Lin, Jhudong Township (TW); An-Shen Chang, Jubei (TW); Ryan Chia-Jen Chen, Chiayi (TW); Chao-Cheng Chen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,104

(22) Filed: Feb. 19, 2024

(65) Prior Publication Data

US 2024/0194785 A1    Jun. 13, 2024

Related U.S. Application Data

(60) Continuation of application No. 17/403,318, filed on Aug. 16, 2021, now Pat. No. 11,908,939, which is a
(Continued)

(51) Int. Cl.
*H10D 30/62* (2025.01)
*H10D 30/01* (2025.01)
(Continued)

(52) U.S. Cl.
CPC .......... *H10D 30/62* (2025.01); *H10D 30/024* (2025.01); *H10D 64/01* (2025.01);
(Continued)

(58) Field of Classification Search
CPC ..................................................... H10D 30/62
(Continued)

(56) References Cited

U.S. PATENT DOCUMENTS 8,617,996 B1 * 12/2013 Chi .................. H10D 84/0193
438/587
8,753,940 B1    6/2014 Wei et al.
(Continued)

FOREIGN PATENT DOCUMENTS

CN    106653606 A    5/2017

*Primary Examiner* — Ajay Arora
(74) *Attorney, Agent, or Firm* — HAYNES AND BOONE, LLP

(57) ABSTRACT

A fin-type field-effect transistor (FinFET) device includes a plurality of fins formed over a substrate. The semiconductor device further includes a dielectric layer filled in a space between each fin and over a first portion of the plurality of fins and a dielectric trench formed in the dielectric layer. The dielectric trench has a vertical profile. The semiconductor device further includes a second portion of the plurality of fins recessed and exposed in the dielectric trench. The second portion of the plurality of fins have a rounded-convex-shape top profile.

20 Claims, 9 Drawing Sheets

Related U.S. Application Data continuation of application No. 16/876,753, filed on May 18, 2020, now Pat. No. 11,094,825, which is a continuation of application No. 15/817,648, filed on Nov. 20, 2017, now Pat. No. 10,658,509, which is a continuation of application No. 14/882,144, filed on Oct. 13, 2015, now Pat. No. 9,825,173, which is a division of application No. 14/162,598, filed on Jan. 23, 2014, now Pat. No. 9,190,496.

(51) Int. Cl.
| | |
|---|---|
| *H10D 64/01* | (2025.01) |
| *H10D 84/01* | (2025.01) |
| *H10D 84/03* | (2025.01) |
| *H10D 86/01* | (2025.01) |

(52) U.S. Cl.
CPC ....... *H10D 84/0158* (2025.01); *H10D 84/038* (2025.01); *H10D 86/011* (2025.01)

(58) Field of Classification Search
USPC .......................................................... 257/401
See application file for complete search history.

(56) References Cited

U.S. PATENT DOCUMENTS

| | | |
|---|---|---|
| 9,170,496 B2 | 10/2015 | Fu et al. |
| 9,825,173 B2 | 11/2017 | Lin et al. |
| 10,658,509 B2 | 5/2020 | Lin et al. |
| 2005/0045965 A1 | 3/2005 | Lin et al. |
| 2007/0057325 A1 | 3/2007 | Hsu et al. |
| 2008/0014699 A1* | 1/2008 | Torek ................ H10D 30/024 438/257 |
| 2008/0217790 A1 | 9/2008 | Hasunuma |
| 2010/0258870 A1 | 10/2010 | Hsu et al. |
| 2012/0313169 A1 | 12/2012 | Wahl et al. |
| 2013/0277720 A1 | 10/2013 | Kim et al. |
| 2013/0277759 A1 | 10/2013 | Chen et al. |
| 2014/0120678 A1 | 5/2014 | Shinriki et al. |
| 2015/0129980 A1 | 5/2015 | Wang et al. |
| 2015/0206954 A1 | 7/2015 | Lin et al. |
| 2016/0035874 A1 | 2/2016 | Lin et al. |
| 2018/0090607 A1 | 3/2018 | Lin et al. |
| 2020/0279945 A1 | 9/2020 | Lin et al. |
| 2021/0376141 A1 | 12/2021 | Lin et al. |

* cited by examiner

METHOD OF MAKING A FINFET DEVICE INCLUDING A STEP OF REMOVING A PORTION OF A FIN

PRIORITY DATA

The present application is a continuation application of U.S. patent application Ser. No. 17/403,318, filed Aug. 16, 2021, which is a continuation application of U.S. patent application Ser. No. 16/876,753, filed May 18, 2020, which is a continuation application of U.S. patent application Ser. No. 15/817,648, filed Nov. 20, 2017, which is a continuation application of U.S. patent application Ser. No. 14/882,144, filed Oct. 13, 2015, which is a divisional application of U.S. patent application Ser. No. 14/162,598, filed Jan. 23, 2014, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
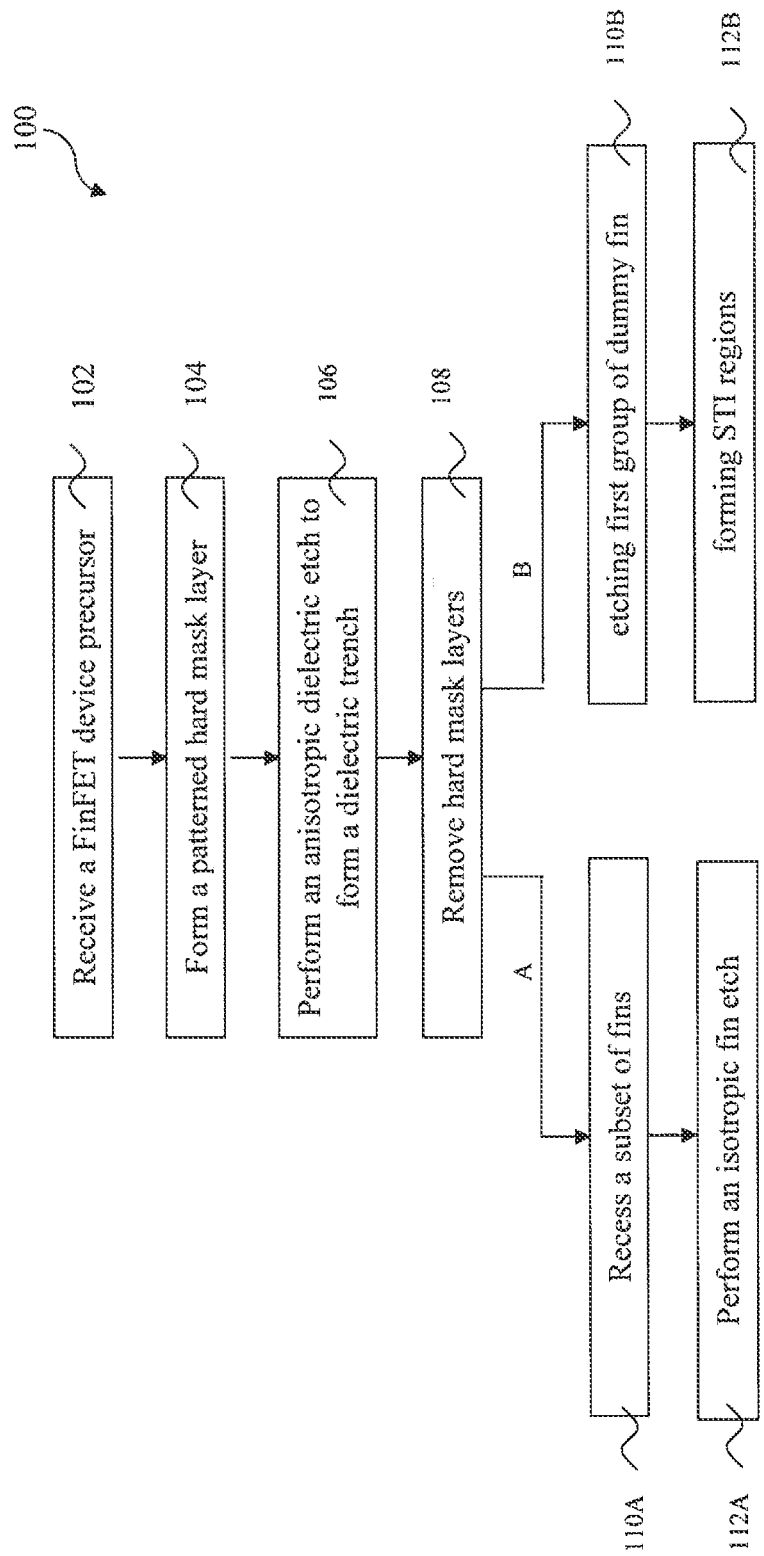
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 2:
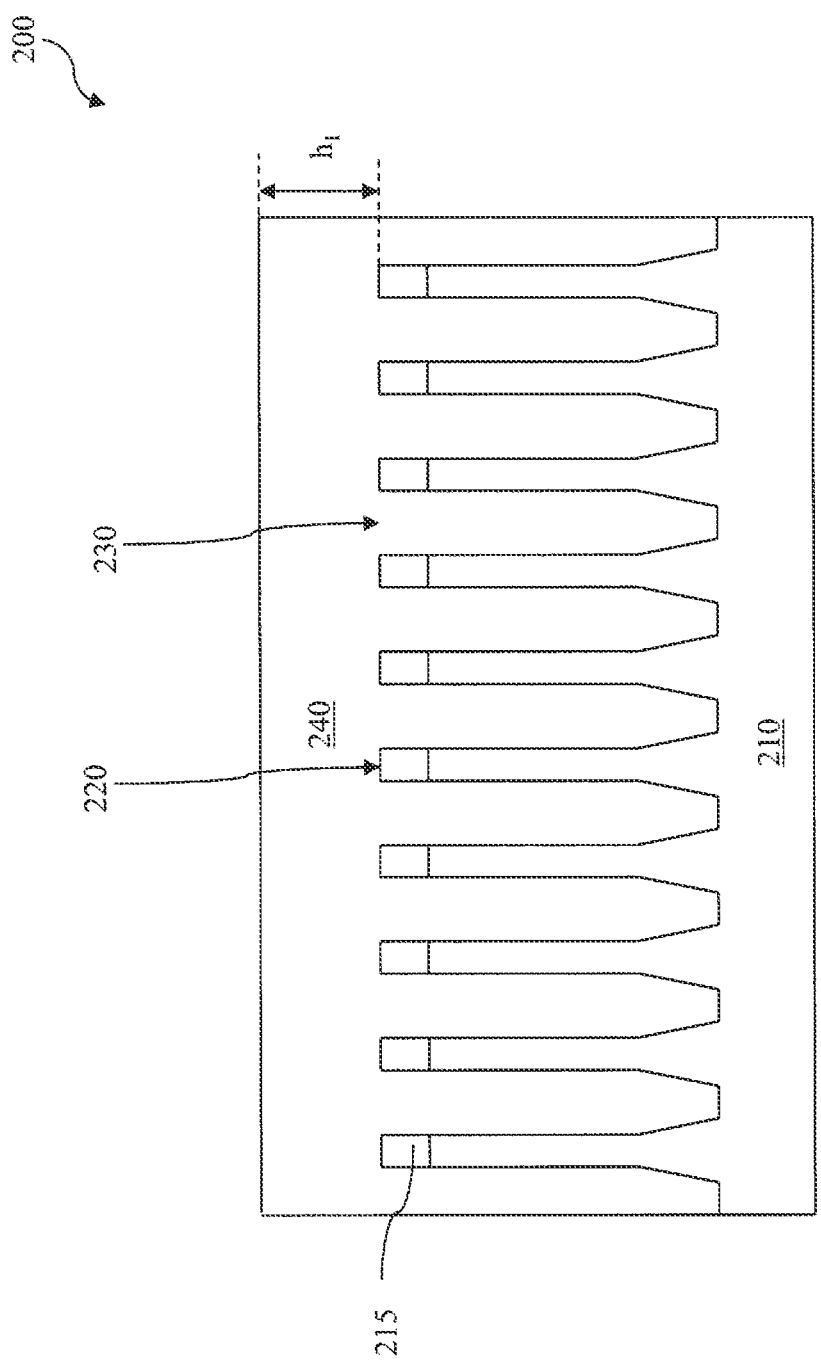
FIG. 2 is a cross-section view of an example FinFET device precursor at fabricated stages constructed according to the method of FIG. 1.

FIG. 1 is a flowchart of a method 100 for fabricating a FinFET device 500 according to aspects of the present disclosure. FIG. 2 is a cross-section view of a FinFET device precursor 200 at fabrication stages constructed according to the method 100 of FIG. 1. FIGS. 3-9 are cross-section views of the FinFET device 500 at fabrication stages constructed according to the method 100 of FIG. 1. The FinFET device precursor 200 and the FinFET device 500 are collectively described with reference to FIGS. 1-9. It is understood that additional steps can be provided before, during, and after the method 100, and some of the steps described can be replaced or eliminated for other embodiments of the method.

Referring to FIGS. 1 and 2, the method 100 begins at step 102 by receiving a FinFET device precursor 200. The FinFET device precursor 200 includes a substrate 210. The substrate 210 includes silicon. In another embodiment, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The FinFET device precursor 200 also includes a plurality of fins 220 and substrate trenches 230 (a space between each of fins) formed over the substrate 210. The fins 220 and the substrate trenches 230 may be formed by one or more procedures such as deposition, lithography and etching. In one embodiment, a first hard mask layer is formed over the substrate 210. The first patterned hard mask layer 215 may include may include silicon nitride, silicon oxide, silicon carbide, titanium oxide, titanium nitride, tantalum oxide, tantalum nitride, or any suitable materials. A patterned photoresist layer is then formed over the first hard mask layer to define fins 220 and the substrate trenches 230. Generally, a patterning process may include photoresist coating (e.g., spin-on coating), exposing, developing the photoresist, other suitable processes, or combinations thereof. Alternatively, the photolithography exposing process is implemented or replaced by other proper methods such as maskless photolithography, electron-beam writing, direct-writing, and/or ion-beam writing. The first hard mask layer is then etched through the pattern photoresist layer to form the first patterned hard mask layer 215. The substrate 210 is then etched through the first patterned hard mask layer 215 to form fins 220 and substrate trenches 230. The substrate 210 may be etched by various methods, including a dry etch, a wet etch, or a combination of thereof.

The FinFET device precursor 200 also includes a dielectric layer 240 formed over the substrate 210, including filling in the substrate trenches 230. In one embodiment, the substrate trench 230 filled with the dielectric layer 240 serves as an isolation region to separate various device regions in the substrate 210. The dielectric layer 240 may include silicon oxide, silicon nitride, oxynitride, a dielectric material having a dielectric constant (k) lower than thermal silicon oxide (therefore referred to as low-k dielectric material layer), or other suitable dielectric material layer. The dielectric layer 240 may include a single layer or multiple layers. In the present embodiment, the dielectric layer 240 may include a material which is different from the first patterned hard mask layer 215 to achieve etching selectivity during a subsequent etch process. The dielectric layer 240 may be deposited by chemical vapor deposition (CVD), atomic layer deposition (ALD) or spin-on coating. Additionally, a chemical mechanical polishing (CMP) process may be performed to planarize top surfaces of the dielectric layer 240. In the present embodiment, a final thickness of the dielectric layer 240 is controlled such that it is above the fins 220 with a first height $h_1$. The first height $h_1$ is designed to be adequate for a later isotropic dielectric etch, which will be described later.

Figure 3:
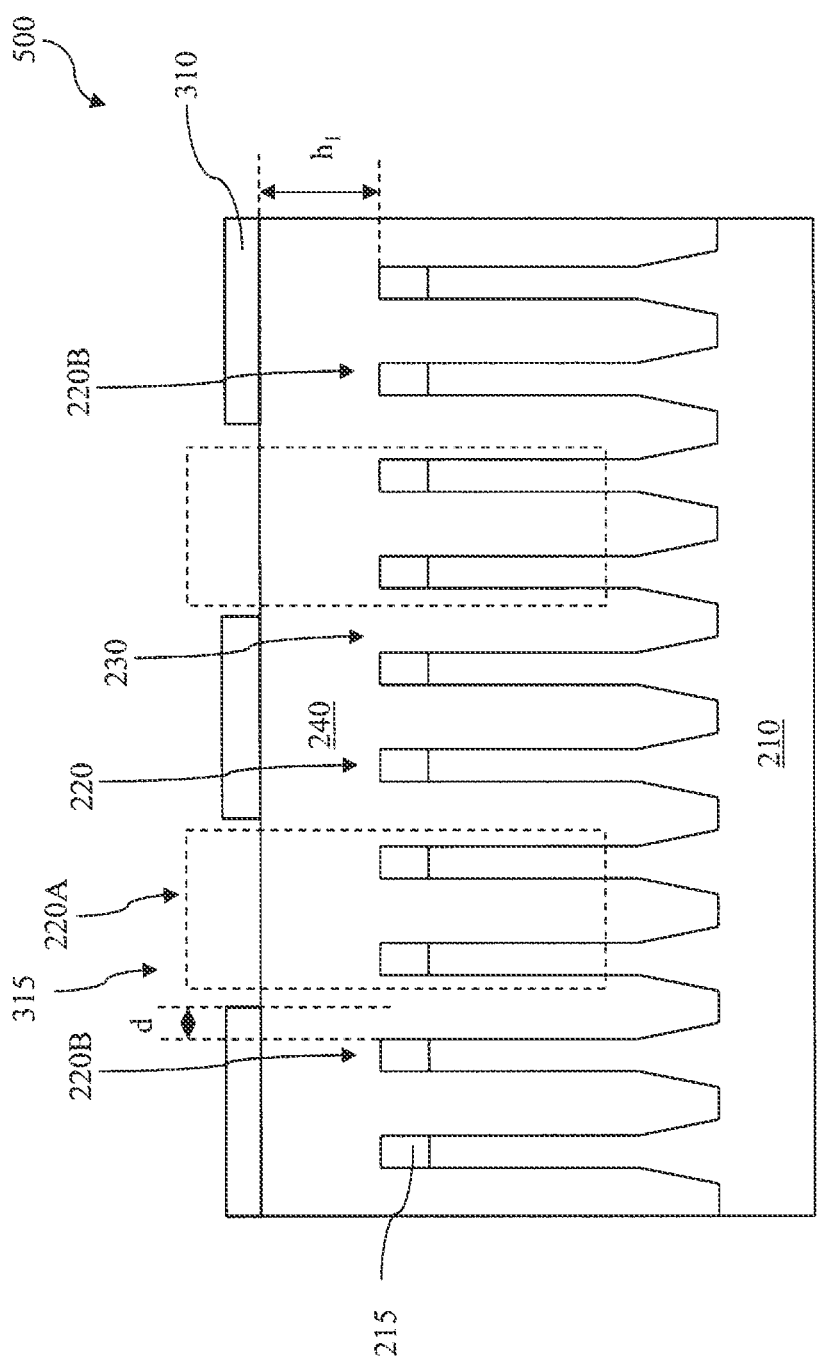
FIGS. 3 to 9 are cross-sectional views of an example FinFET device at fabrication stages constructed according to the method of FIG. 1.

Referring to FIGS. 1 and 3, once the FinFET device precursor 200 is received, the method 100 proceeds to step 104 by forming a second patterned hard mask layer 310 over the dielectric layer 240. The second patterned hard mask layer 310 has openings 315. The openings 315 are formed such that they align to a respective subset of fins 220, now labeled with the reference number 220A. The fins not aligned with the mask layer openings are labeled with the reference number 220B. In one embodiment, the subset of fins 220A includes more than one fin. In one embodiment, an edge of the opening 315 is designed to align having a distance "d" away from the nearest fin 220B. The distance d is designed to be adequate such that the fin 220B is not adversely affected during a later anisotropic dielectric etch, which will be described later.

The second patterned hard mask layer 310 may include silicon nitride, silicon oxide, silicon carbide, titanium oxide, titanium nitride, tantalum oxide, tantalum nitride, or any suitable materials. In the present embodiment, the second patterned hard mask layer may include a material being different from the dielectric layer 240 to achieve etching selectivity during a subsequent etch process. In one embodiment, the second patterned hard mask layer 310 includes the same material as the first patterned hard mask layer 215 to obtain a process flexibility in the subsequent etch, which will be described later. The second patterned hard mask layer 310 may be formed by one or more procedures such as deposition, lithography and etching and deposition.

Figure 4:
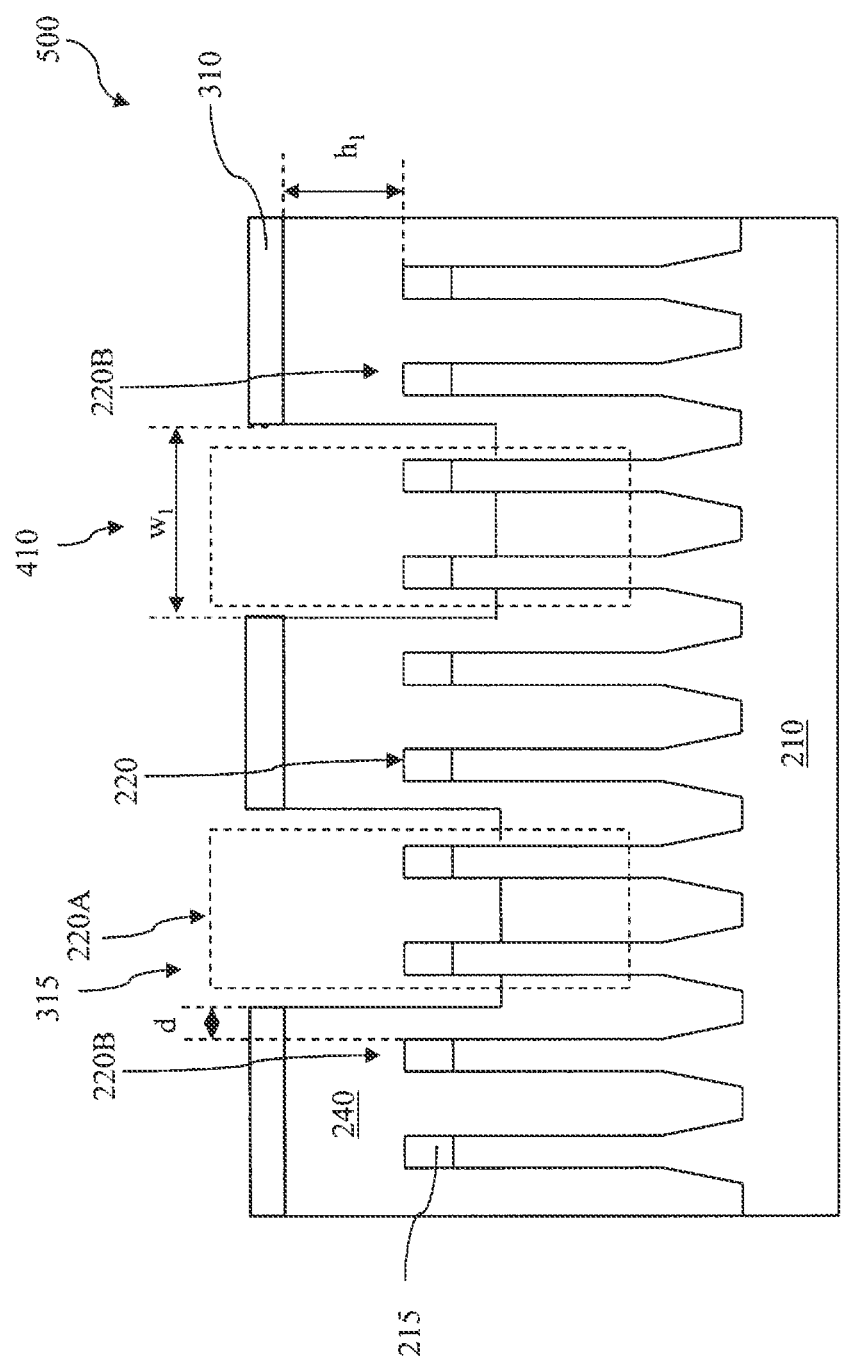

Referring to FIGS. 1 and 4, the method 100 proceeds to step 106 by performing an anisotropic dielectric etch by using the second patterned hard mask layer 310 as an etch mask. Through the opening 315, a portion of the dielectric layer 240 is removed to form a dielectric trench 410 and expose the subset of fins 220A, including first patterned hard mask 215. The dielectric trench 410 is formed with a substantially vertical profile, which ensures that the fin 220B are not adversely affected during the anisotropic dielectric etch. The dielectric trench 410 has a first width $w_1$. The anisotropic dielectric etch may include a plasma dry etching process using a fluorine-based chemistry, such as $CF_4$, $SF_6$, $CH_2F_2$, $CHF_3$, and/or $C_2F_6$. The anisotropic dielectric etch selectively removes the dielectric layer 240 but does not substantially etch the subset of fins 220A. (That is, the etch rate on the fins 220A is significantly lower than that of the dielectric layer 240.) Thus a top portion of the subset of fins 220A is exposed in the dielectric trench 410. With the vertical profile of the dielectric trench, the distance d provides extra insurance that the fin 220B is not impacted adversely during the anisotropic etch. Thus, etch process constrains are relaxed. In one embodiment, a depth of the anisotropic dielectric etch is controlled such that the portions of the first patterned hard mask 215 on the fins 220A are fully exposed.

Figure 5:
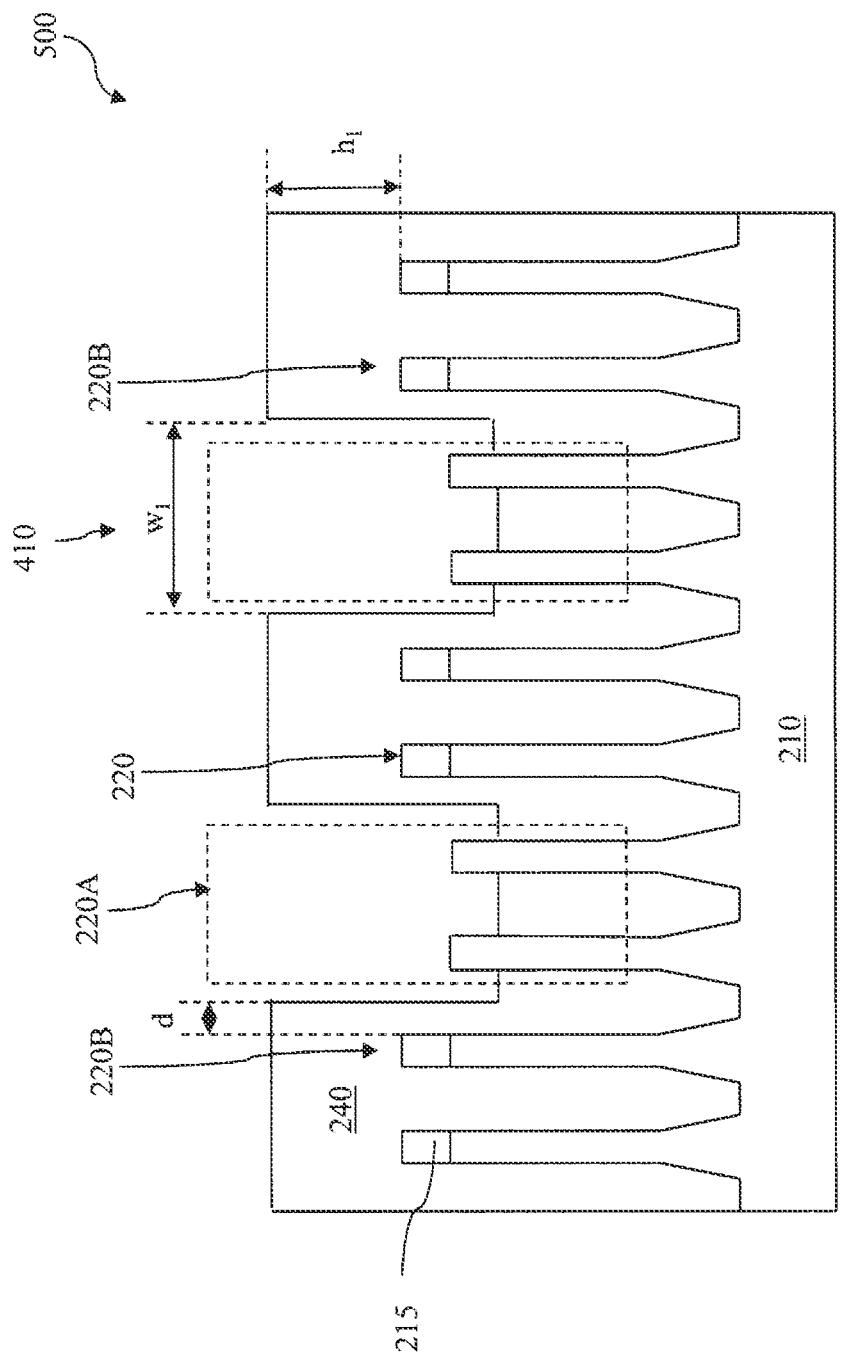

Referring to FIGS. 1 and 5, the method 100 proceeds to step 108 by removing the portions of the first patterned hard mask 215 on the fins 220A and the second patterned hard mask layer 310. The first patterned hard mask layer 215 and the second hard mask layer 310 may be removed by a selective dry etch, a selective wet etch, or combination thereof. The etching selectively removes both the first patterned hard mask layer 215 and the second hard mask layer 310 but does not substantially etch the dielectric layer 240 and the subset of fins 220A. In one embodiment, the first patterned hard mask layer 215 and the second hard mask layer 310 are removed in a single etch process. In this embodiment, the first patterned hard mask layer 215 and the second patterned hard mask layer 310 can be formed of similar material, which provides process flexibility and improves the process window of the etch process.

The method 100 has two paths after step 108, identified by the suffix "A" and "B," respectively. Both paths are separately discussed below.

Figure 6:
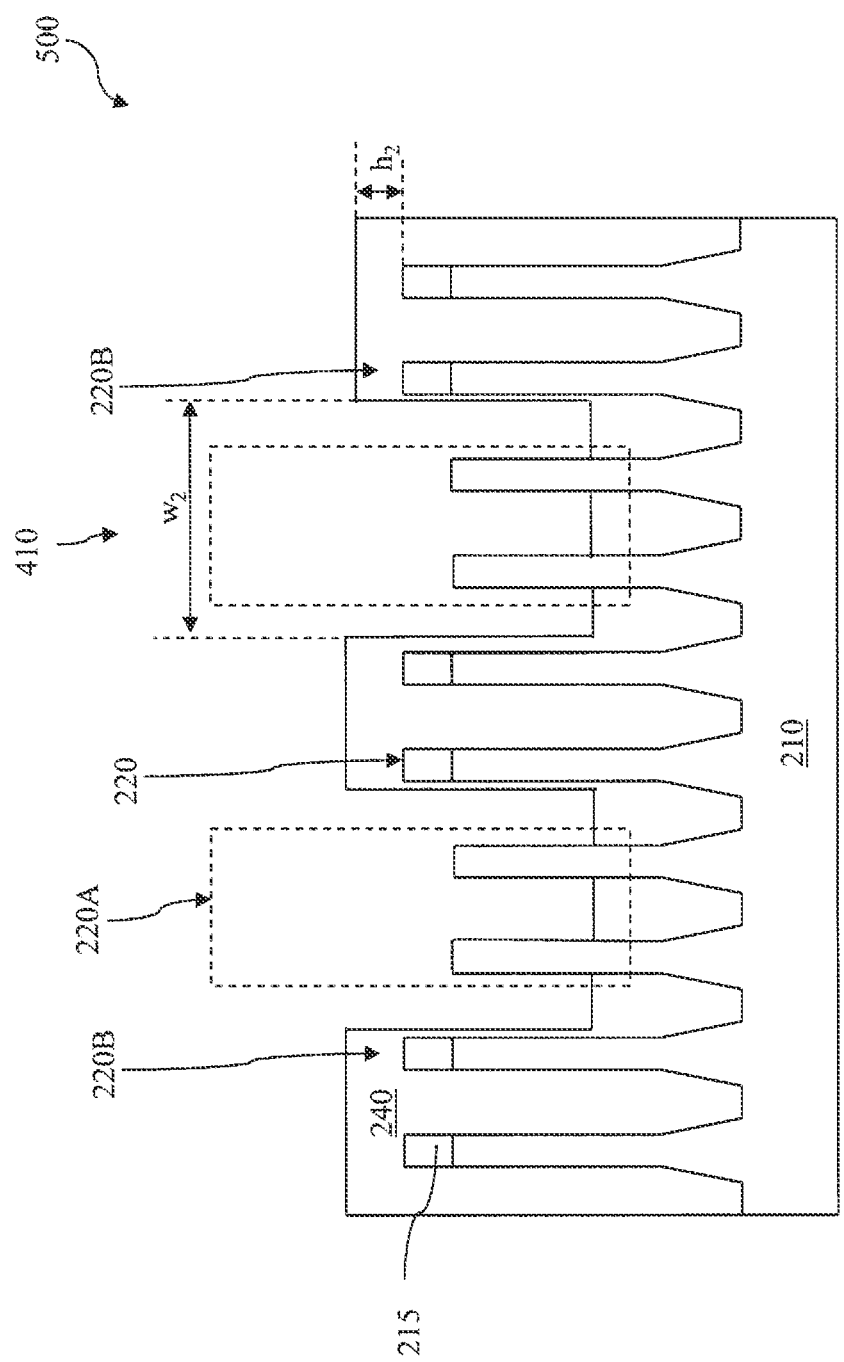

Referring to FIGS. 1 and 6, the method 100 proceeds to step 110A by performing a selective isotropic dielectric etch without using an etch mask. The selective isotropic etch selectively etches the dielectric layer 240 but does not substantially etch the subset of fins 220A in the dielectric trench 410. The dielectric layer 240 is etched in both of vertical and horizontal directions such that the first width $w_1$ of the dielectric trench 410 is enlarged to a second width $w_2$ and the first height $h_1$ of the dielectric layer 240 above the fin 220 is reduced to a second height $h_2$, but it is still adequate to protect the fins 220, including the fins 220B, during the selective isotropic dielectric etch. Here the vertical direction is a direction along a height of the fin 220 and the horizontal direction is perpendicular to the vertical direction. The dielectric trench 410 becomes deeper during the selective isotropic dielectric etch as well. Thus, the enlarged dielectric trench 410 (with a wider width and a deeper depth) may leave more space to facilitate a full exposure of a top portion of the subset of fins 220A (to be recessed later), which may improve the recess process window. The selective isotropic dielectric etch may include a dry etch, a wet etch, or combination thereof. In one embodiment, the selective isotropic dielectric etch includes a plasma dry etching process using $NF_3$-containing gases.

Figure 7:
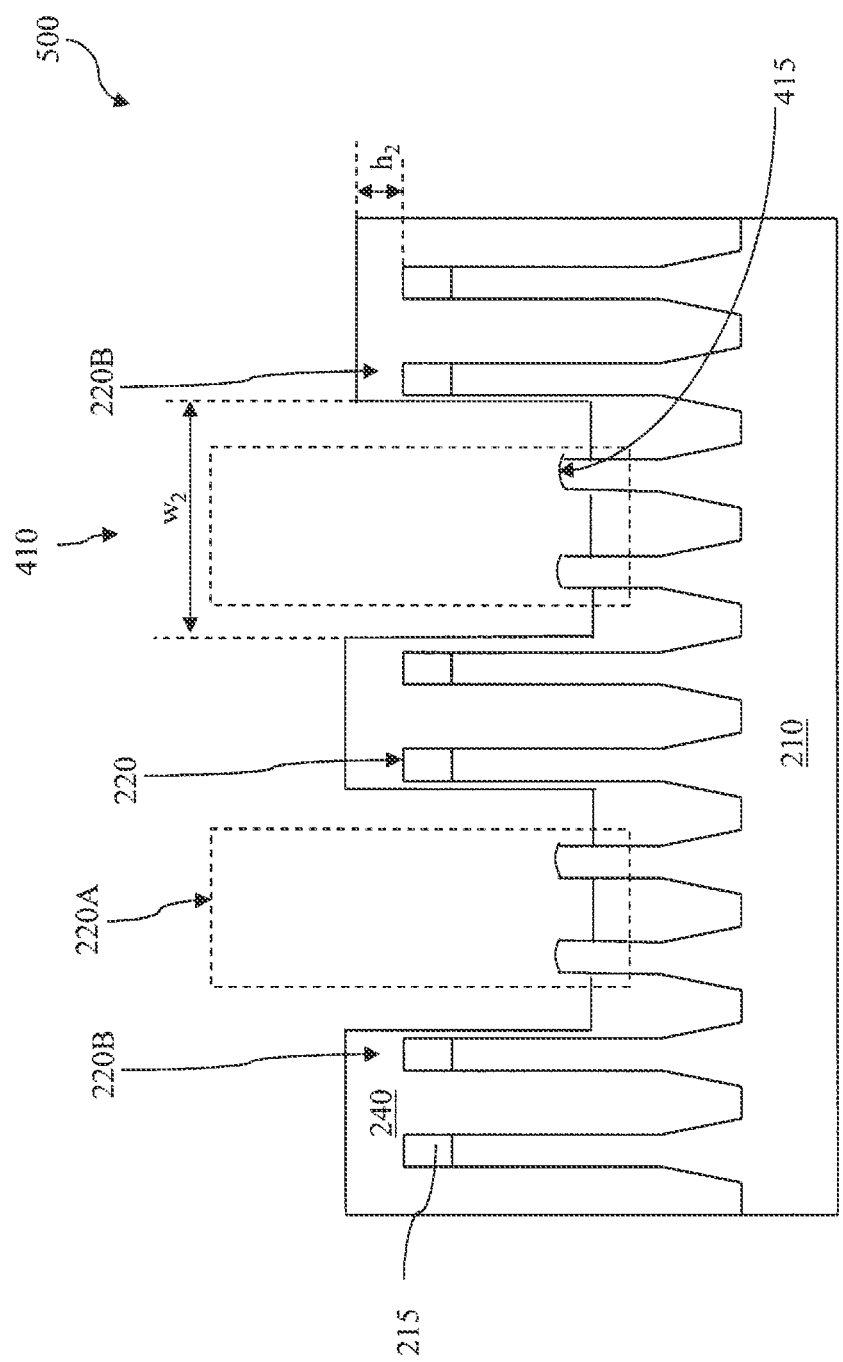

Referring to FIGS. 1 and 7, the method 100 proceeds to step 112A by recessing a portion of the subset of fins 220A in the dielectric trench 410. The recess selectively etches the subset of fins 220A but does not substantially etch the dielectric layer 240. The recessing process may include a selective wet etch or a selective dry etch, or combination thereof. In one embodiment, a selective wet etching solution includes a tetramethylammonium hydroxide (TMAH), a HF/HNO3/CH3COOH solution, or other suitable solution. Dry etching process may include a biased plasma etching process that uses a chlorine-based chemistry, such as such as $Cl_2$, $CHCl_3$, $CCl_4$, and/or $BCl_3$). In one embodiment, the recess is an isotropic etch by using gases of $C_{12}$ with $NF_3$ in a ratio of 40:1 and leave a top portion of the recessed subset of fins 220A with a rounded-convex-shape top profile 415.

Figure 8:
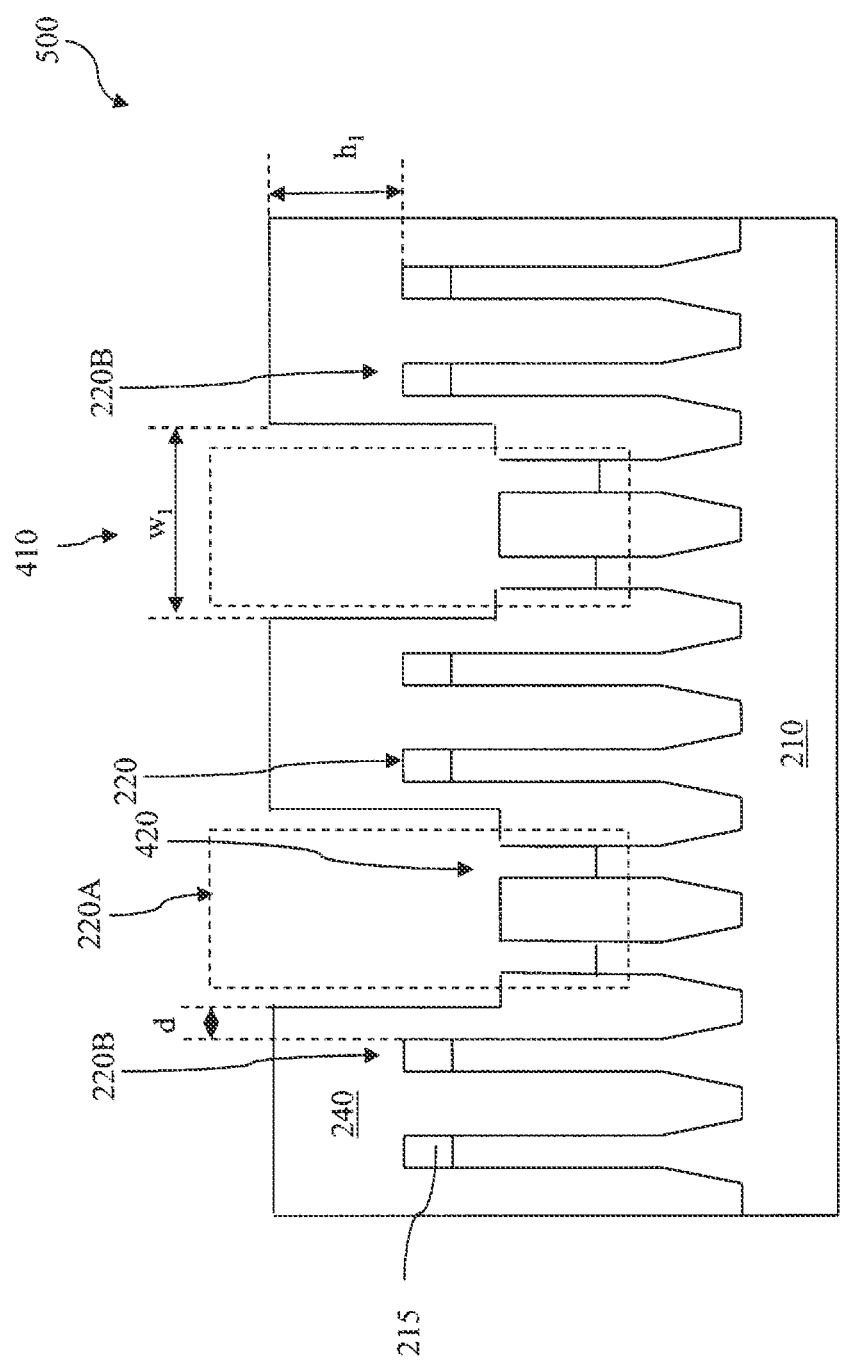

Referring to FIGS. 1 and 8, alternatively, after completing the step 108, the method 100 proceeds to 110B (instead of 110A) by anisotropically recessing the subset of fins 220A to form a sub-dielectric-trench 420 in the dielectric trench 410. In one embodiment, without using an etch mask, the anisotropic fin etch selectively etches the subset of fins 220A but does not substantially etch the dielectric layer 240. Therefore, the dielectric layer 240 protects the fins 220, including the fin 220B as well during the anisotropic etch. In the present embodiment, the anisotropic fin etch mainly etches in a vertical direction and a depth of the anisotropic etch is controlled to achieve a predetermined recessing depth. The anisotropic fin etch may include a dry etching process using a chlorine-based chemistry, such as $Cl_2$, $CHCl_3$, $CCl_4$, and/or $BCl_3$). In one embodiment, the anisotropic fin etch is a dry etching by using $Cl_2$ with oxygen in a ratio of 5:1.

Figure 9:
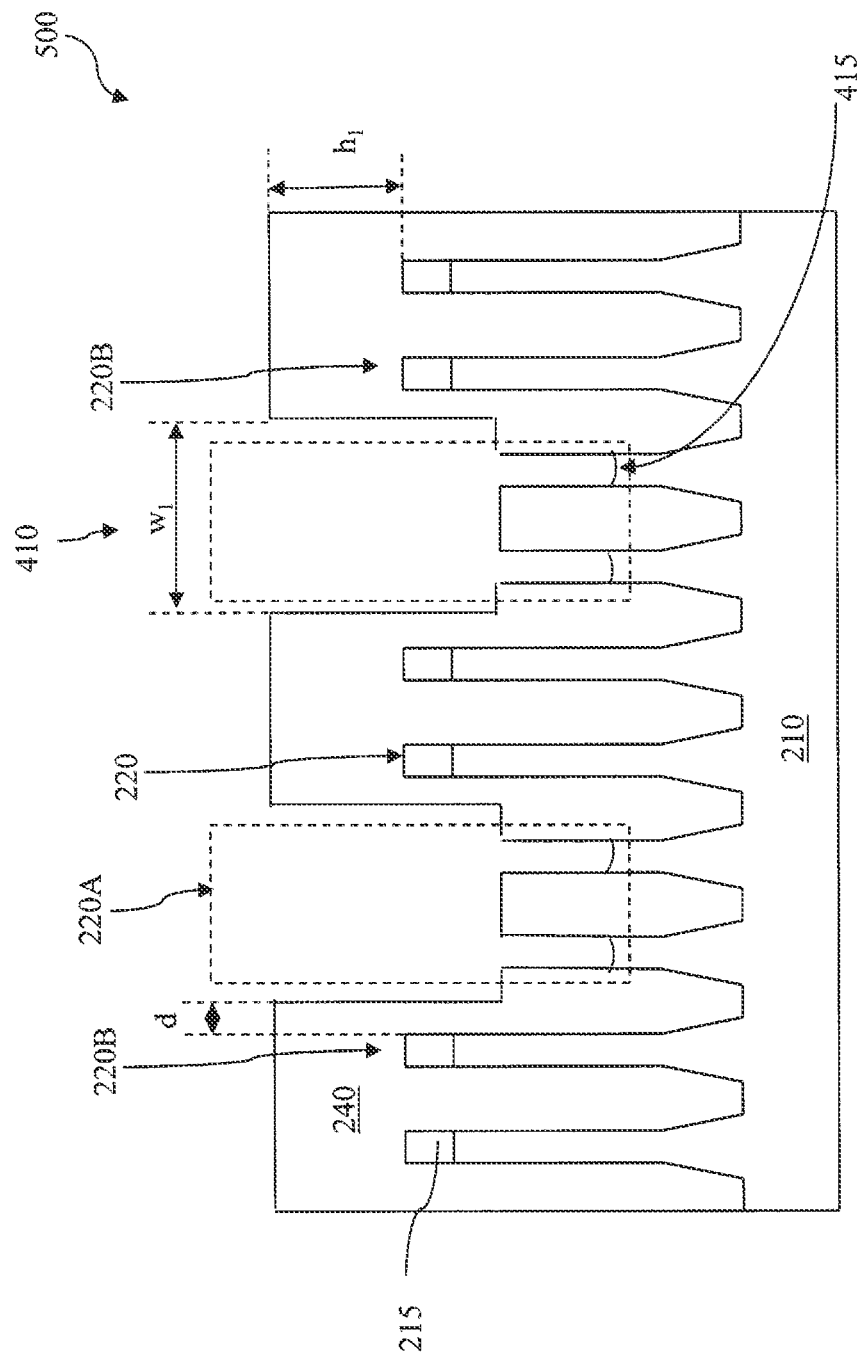

Referring to FIGS. 1 and 9, after completing step 110A, the method 100 proceeds to 112B by isotropically etching the recessed subset of fins 220A in the sub-dielectric-trench 420. During previous anisotropic fin etch in step 110A, a residual film of the subset of fins 220A may be left along a sidewall of the sub-dielectric-trench 420 (also referring as a horn structure), which may cause current leakage leading yield loss of the FinFET device. The isotropic fin etch may help to remove those residual films of the subset of fins 220A. The isotropic fin etch selectively etches the subset of fins 220A but does not substantially etch the dielectric layer 240. In one embodiment, the isotropic fin etch leaves a top portion of the recessed subset of fins 220A with a rounded-concave-shape top profile 425 in the sub-dielectric-trench 420. The isotropic fin etch may include a wet etch or a dry etch, or combination thereof. In one embodiment, the isotropic fin etch is wet etching solution includes a TMAH, a HF/HNO3/CH3COOH solution, or other suitable solution.

In another embodiment, the isotropic fin etch is a dry etch by using gases of $Cl_2$ with $NF_3$ in a ratio of 40:1.

The FinFET device 500 may also undergo further CMOS or MOS technology processing to form various features and regions known in the art. For example, high-k/metal gate (HK/MG) stacks are formed over the substrate 210, including over (wrapping) a portion of the fins 220. For another example, source and drain (S/D) regions are formed on each side of the HK/MG stacks. S/D regions may be formed by recess, epitaxial growth, and implant techniques. Subsequent processing may also form various contacts/vias/lines and multilayers interconnect features (e.g., metal layers and interlayer dielectrics) on the substrate 210, configured to connect the various features or structures of the FinFET device 500. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers methods for fabricating a FinFET device. The method employs forming a vertical dielectric trench to expose a subset of fins and being followed by an isotropic dielectric etch to an enlarging the dielectric trench. This dual dielectric etch scheme reduces a risk of impacting adversely on the fin adjacent to the dielectric trench. The method also employs a dual fin etch scheme of an anisotropic etch followed by an isotropic etch. The method effectively eliminates fin film residual issue in fin recess process. The method demonstrates improvements of process window and process flexibility.

The present disclosure provides many different embodiments of fabricating a FinFET device that provide one or more improvements over the prior art. In one embodiment, a method for fabricating a FinFET device includes receiving a precursor. The precursor has a plurality of fins over a substrate and a dielectric layer filling in a space between each of fins and extending above the fins. The method also includes forming a patterned hard mask layer having an opening over the dielectric layer, etching the dielectric layer through the opening to form a trench with vertical profile. A subset of the fins is exposed in the trench. The method also includes performing an isotropic dielectric etch to enlarge the trench in a horizontal direction, which is perpendicular to the vertical profile of the trench. The method also includes performing an anisotropic etch to recess the subset of fins in the trench and performing an isotropic fin etch to etch the recessed subset of fins.

In yet another embodiment, a method for fabricating a FinFET device includes receiving a precursor. The precursor has a plurality of fins over a substrate and a dielectric layer filling in a space between each of fins and extending above the fins. The method also includes forming a patterned hard mask layer having an opening over the dielectric layer, etching the dielectric layer through the opening to form a trench with vertical profile. Therefore a subset of fins is exposed in the trench. The method also includes recessing the subset of fins to form a subset of dielectric trenches in the trench and performing an isotropic fin etch to etch the recessed subset of fins in the subset of dielectric trenches.

In another embodiment, a FinFET device includes a substrate, a plurality of fins formed over the substrate, a dielectric layer filled in a space between each of fins and extends above the fins. The FinFET device also includes a dielectric trench in the dielectric layer and a subset of recessed fins are exposed in the dielectric trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a first fin and a second fin on a substrate, wherein a first hard mask layer is disposed directly on the first fin;
   forming a dielectric layer directly on the first fin, the first hard mask layer and the second fin such that the dielectric layer covers the first fin, the first hard mask layer and the second fin;
   removing a first portion of the dielectric layer, wherein the dielectric layer covers the second fin after the removing of the first portion of the dielectric layer, wherein a portion of the first hard mask layer disposed directly on the first fin is exposed after the removing of the first portion of the dielectric layer; and
   after removing the first portion of the dielectric layer, removing at least a portion of the first fin.

2. The method of claim 1, wherein a portion of the first fin is exposed after the removing of the first portion of the dielectric layer.

3. The method of claim 1, wherein the removing of the first portion of the dielectric layer includes performing an anisotropic etching process, and
   wherein the removing of at least the portion of the first fin includes performing an isotropic etching process.

4. The method of claim 1, wherein the removing of the first portion of the dielectric layer includes performing a first anisotropic etching process, and
   wherein the removing of at least the portion of the first fin includes performing a second anisotropic etching process.

5. The method of claim 1, further comprising removing a second portion of the dielectric layer to expose a portion of the first fin after the removing of the first portion of the dielectric layer.

6. The method of claim 1, wherein the providing of the first fin and the second fin on the substrate includes the first hard mask layer being further disposed directly on the second fin, and
   wherein the dielectric layer further covers the first hard mask layer disposed directly on the second fin after the removing of the first portion of the dielectric layer.

7. The method of claim 1, wherein a remaining portion of the first fin is recessed relative to a top surface of the dielectric layer after the removing of at least the portion of the first fin.

8. The method of claim 1, wherein the first fin and the second fin extend to the same height above the substrate after the providing of the first fin and the second fin on the substrate.

9. A method comprising:
   forming fins over a substrate;
   forming a dielectric layer directly on the fins;
   removing a first portion of the dielectric layer to form a trench within the dielectric layer, wherein a first subset of the fins is exposed in the trench, wherein at least one fin from the first subset of the fins includes a semiconductor material layer that is exposed in the trench after the removing of the first portion of the dielectric layer; and
   recessing the first subset of fins.

10. The method of claim 9, wherein a second subset of fins is covered by the dielectric layer after the removing of the first portion of the dielectric layer to form the trench within the dielectric layer.

11. The method of claim 9, wherein the fins have a hard mask layer disposed directly thereon, and
    wherein the forming of the dielectric layer directly on the fins includes forming the dielectric layer directly on the hard mask layer.

12. The method of claim 11, further comprising:
    removing the hard mask layer from the first subset of the fins in the trench prior to recessing the first subset of fins.

13. The method of claim 9, wherein the dielectric layer includes an oxide material layer.

14. The method of claim 9, wherein the dielectric layer includes a nitride material layer.

15. The method of claim 9, further comprising etching the recessed first subset of fins.

16. A method comprising:
    forming a plurality of first fins in a first area and a plurality of second fins in a second area, wherein one first fin from the plurality of first fins includes a semiconductor material layer;
    forming a dielectric layer directly on the plurality of first fins in the first area and directly on the plurality of second fins in the second area;
    removing a first portion of the dielectric layer in the first area, wherein a second portion of the dielectric layer remains disposed directly on the plurality of first fins and the plurality of second fins after the removing of the first portion of the dielectric layer in the first area; and
    removing at least a portion of the semiconductor material layer from the one first fin to form a semiconductor protrusion, wherein the semiconductor protrusion physically contacts the dielectric layer after the removing of at least the portion of the semiconductor material layer from the one first fin to form the semiconductor protrusion.

17. The method of claim 16, wherein the semiconductor material layer of the one first fin is exposed after the removing of the first portion of the dielectric layer in the first area.

18. The method of claim 17, wherein the second portion of the dielectric layer extends to a first height in the first area and a second height in the second area after the removing of the first portion of the dielectric layer in the first area, the second height being greater than the first height.

19. The method of claim 16, wherein the plurality of first fins and second fins are formed of the same material, and wherein the plurality of first fins and second fins extend to the same height after the forming of the plurality of first fins in the first area and the plurality of second fins in the second area.

20. The method of claim 16, wherein the semiconductor protrusion has either a convex top surface or a concave top surface after the removing of at least the portion of the semiconductor material layer from the one first fin to form the semiconductor protrusion.

* * * * *